Figure 1:
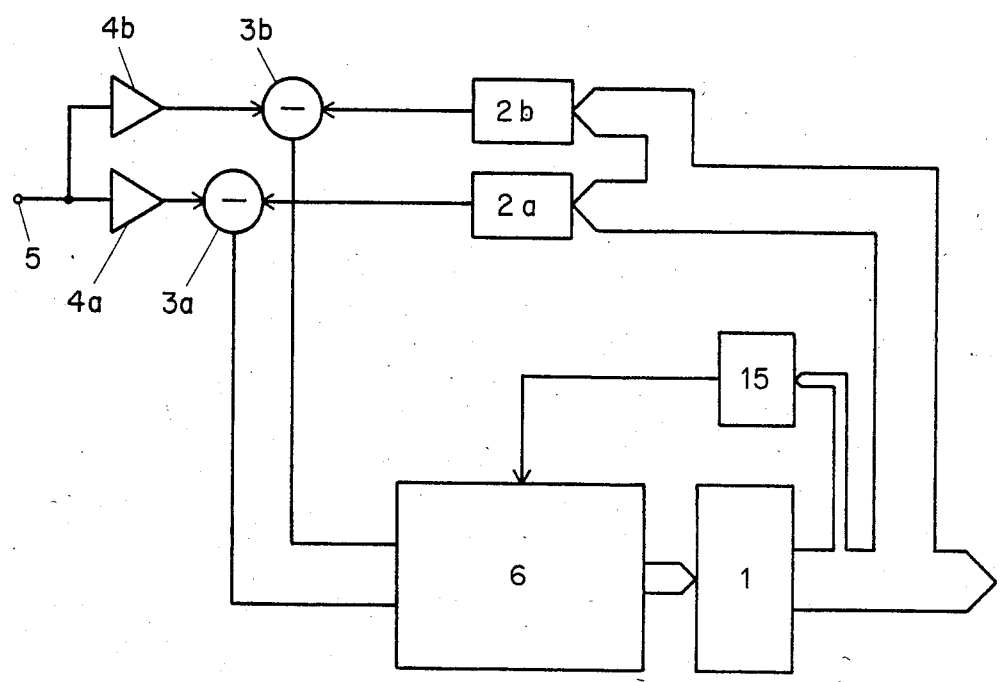

United States Patent [19]

Lanz et al.

[11] Patent Number: 4,590,459
[45] Date of Patent: May 20, 1986

[54] ANALOG/DIGITAL CONVERTER

[75] Inventors: Otto Lanz, Niederrohrdorf; Martin Maschek, Würenlos; Georg Mastner, Niederrohrdorf, all of Switzerland

[73] Assignee: BBC Brown, Boveri & Company, Ltd., Baden, Switzerland

[21] Appl. No.: 733,878

[22] Filed: May 14, 1985

[30] Foreign Application Priority Data

May 15, 1984 [CH] Switzerland .................. 2378/84

[51] Int. Cl.⁴ ............................................. H03M 1/00
[52] U.S. Cl. ..................... 340/347 AD; 340/347 CC
[58] Field of Search .............. 340/347 AD, 347 CC; 375/26

[56] References Cited

U.S. PATENT DOCUMENTS

| | | | |
|---|---|---|---|
| 3,786,491 | 1/1974 | Carleton | 340/347 CC |
| 4,193,066 | 3/1980 | Morrison et al. | 340/347 AD |
| 4,296,412 | 10/1981 | Mastner | 375/26 |
| 4,517,550 | 5/1985 | Nakamura et al. | 340/347 CC |

*Primary Examiner*—William M. Shoop, Jr.
*Assistant Examiner*—Sharon D. Logan
*Attorney, Agent, or Firm*—Oblon, Fisher, Spivak, McClelland & Maier

[57] ABSTRACT

A digital integrator (1) having a 16-bit output is followed by a first 12-bit digital/analog converter (2a) which is supplied with the output bits 1-11 and 16 of the integrator (1) and which forms a first tracking loop with a first subtracter (3a), which forms a first difference signal from the output signal, proportional to the input signal of the analog/digital converter, of a first amplifier (4a) and the output signal of the first digital/analog converter (2a), and a tracking circuit (6) which generates tracking signals for the integrator (1) on the basis of the difference signal. To extend the dynamic range, a second 12-bit digital/analog converter (2b) is present which is supplied with bits 5-16 from the output of the integrator and which forms a second tracking loop with a second subtractor (3b) and a second amplifier (4b), the gain factor of which is 1/16th of the gain factor of the first amplifier (4a), to which loop a control logic (15) switches over when the range which can be covered with the first digital/analog converter (2a) is exceeded. Switching back takes place at the next zero crossing, that is to say change of the most significant bit. The digital/analog converter is particularly suitable for processing the output signal of a current or voltage converter.

2 Claims, 3 Drawing Figures

ANALOG/DIGITAL CONVERTER

The invention relates to an analog/digital converter according to the pre-characterising clause of claim 1.

A generic analog/digital converter is known (U.S. Pat. No. 4,296,412) in which all bits of the digital output signal are supplied to a single digital/analog converter which generates a corresponding analog signal which is compared with a signal which is proportional with a fixed factor to the input signal.

A particular advantage of such a tracking type analog/digital converter consists in the extraordinarily rapid "data refresh" operation which occupies only one clock period under normal operating conditions.

The resolution of such an analog/digital converter and thus the dynamic range with given requirements for the accuracy of conversion of the input signal even if the said requirements apply only to a part of the range swept by the latter, depends on the digital/analog converter used.

The invention has the object of specifying a generic analog/digital converter which, compared with the known generic analog/digital converter comprising digital/analog converters of the same type, achieves a wider dynamic range but at the same time, for as long as the input signal moves within the range in which it could also be processed by the known generic analog/digital converter, converts this signal with at least the same accuracy as the latter. In this arrangement, the widening of the dynamic range should take place without loss of the rapid "data refresh" facility.

This object is achieved by the invention as characterised in the Claims.

The advantages which can be achieved by the invention can be seen especially in the fact that, if digital/analog converters of a given efficiency are used, the dynamic range can be considerably increased as compared with known generic analog/digital converters without any increase in the quantisation error in the range which can be covered with known generic analog/digital converters or having to accept losses in speed.

Analog/digital converters according to the invention are particularly suitable for converting the output signal of a current or voltage converter, particularly of one which can simultaneously be used for measuring and protection purposes since it is not only the undisturbed signal, which remains within a limited range, which can be converted with a high accuracy adequate for measuring purposes, but also high-amplitude disturbances such as occur, for example, with short circuits, can be detected with an accuracy which is adequate at least for protection purposes.

In the text which follows, the invention is explained in greater detail with the aid of drawings, representing only one illustrative embodiment, and of some diagrams. In the drawings, FIG. 1 shows a block diagram of an analog/digital converter according to the invention, FIG. 2 shows a detailed circuit diagram of a section of the analog/digital converter according to the invention according to FIG. 1, and FIG. 3 shows an illustrative variation over time of the input signal, respectively of the output signal corresponding to the input signal, of the analog/digital converter according to the invention according to FIGS. 1 and 2 in analog representation and the variations over time of two bits of the output signal and other signals occurring in the analog/digital converter according to the invention.

Figure 2:
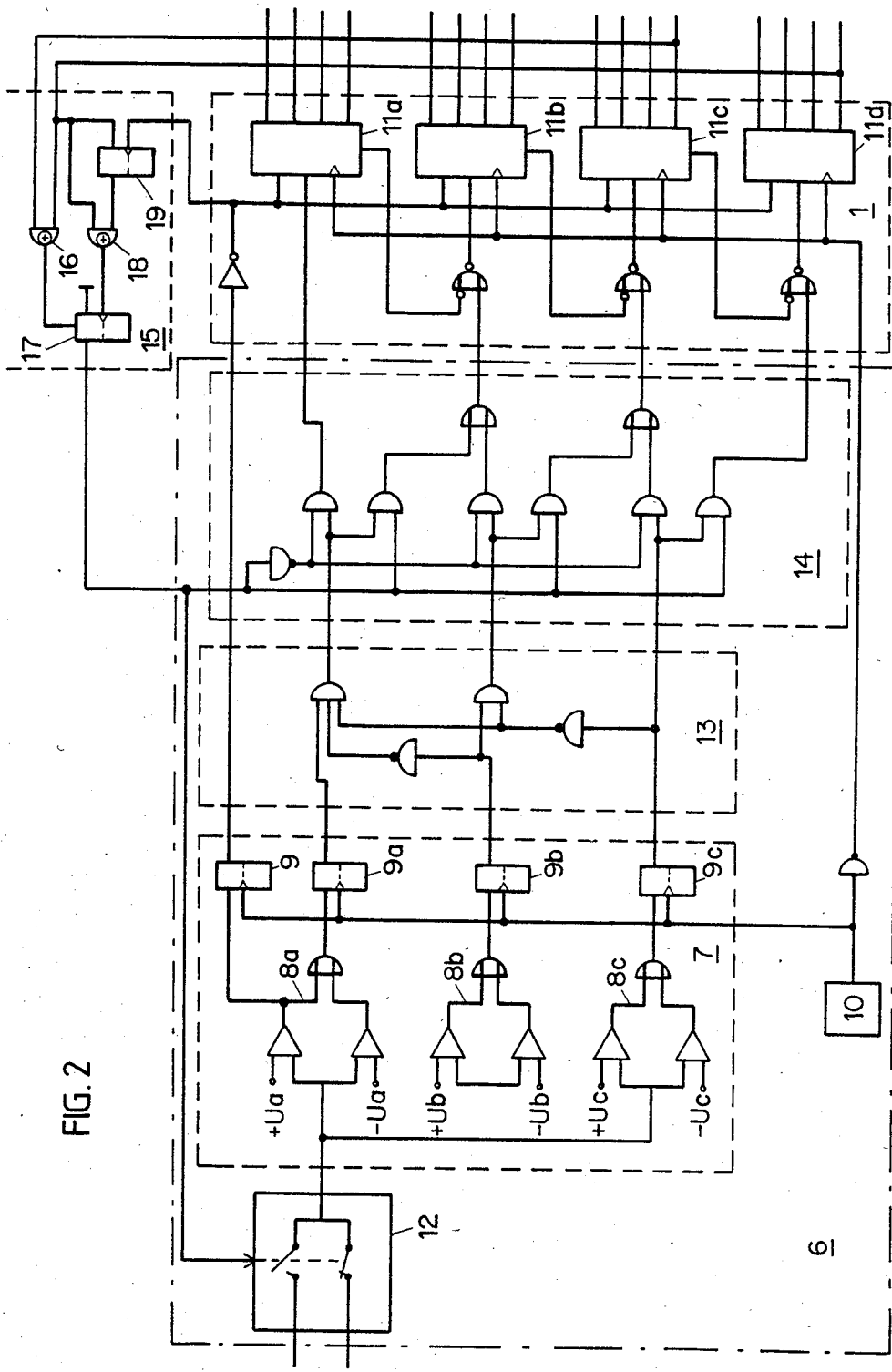
Figure 3:
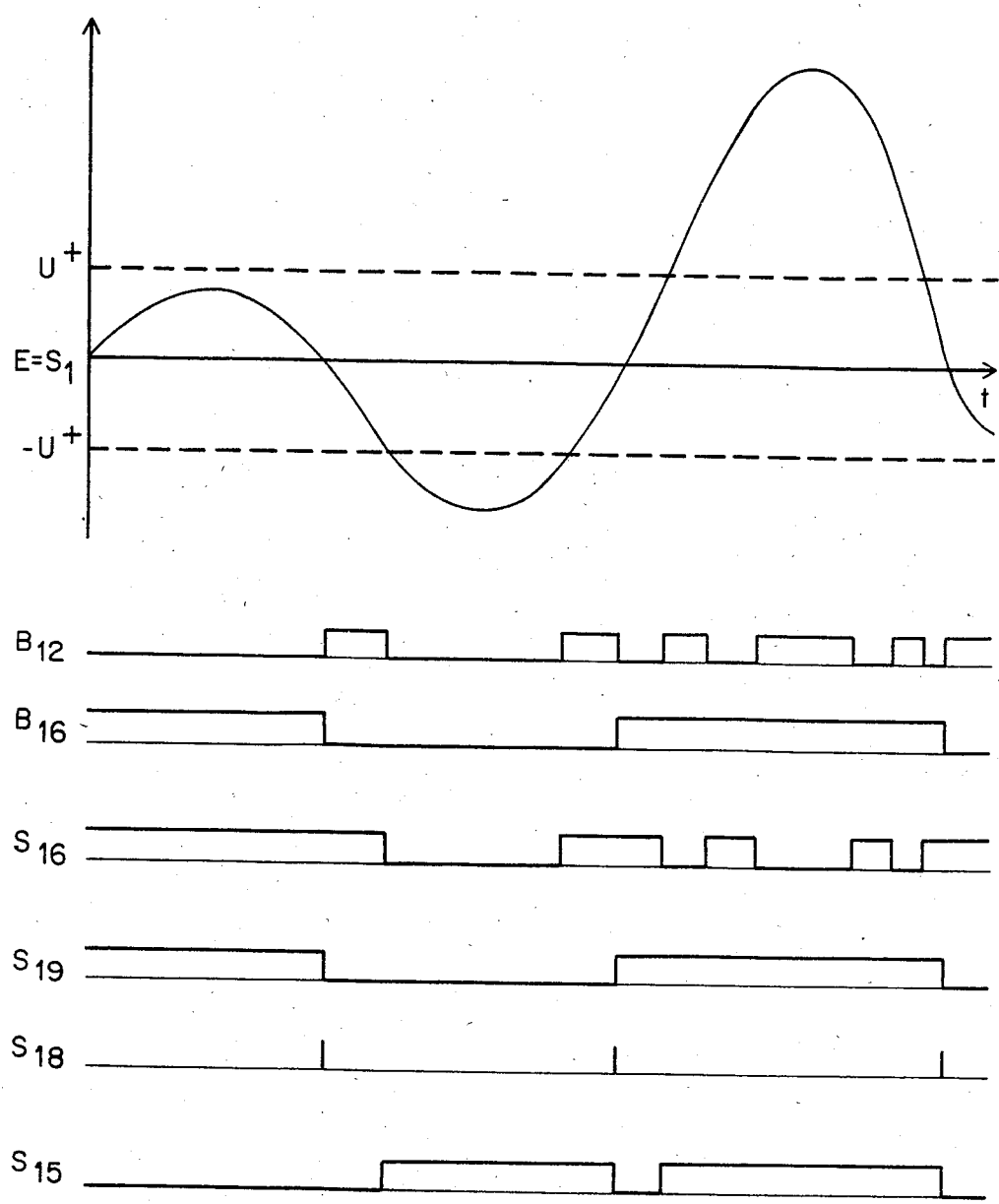

In its basic configuration, the analog/digital converter shown in FIGS. 1 and 2 is provided with a digital integrator 1 having a 16-bit output, a first 12-bit digital/analog converter 2a which follows integrator 1, a first subtracter 3a which forms a first difference signal from the output signal of a first amplifier 4a the input of which is connected to the input terminal 5 of the analog/digital converter and the output signal of the first digital/analog converter 2a and a tracking circuit 6 which precedes the integrator 1 and which is supplied with the said first difference signal. The tracking circuit contains a difference discriminator 7 comprising a first discriminator 8a which determines whether the signal present at the input of the difference discriminator 7 lies between a first lower limit value $-U_a$ and a first upper limit value $+U_a$ and, if not, whether it is positive or negative. In this arrangement, the absolute value $U_a$ of the limit values is a little above one half of the voltage corresponding to a least significant bit. For temporary storage of the two items of information, the first discriminator 8a is followed by two D-type flipflops 9, 9a which, like the integrator 1, are controlled by a clock generator 10.

According to the invention, the integrator 1 is followed by a second 12-bit digital/analog converter 2b and a second subtracter 3b is present which forms from the output signal of a second amplifier 4b which is connected to the input terminal 5 and the gain factor of which is 1/16th of the gain factor of the first amplifier 4a and from the output signal of the second digital/analog converter 2b a second difference signal which is also fed to the tracking circuit 6. The digital integrator 1 is constructed as a four-stage cascade of 4-bit up/down counters 11a, b, c, d. The first digital/analog converter 2a is in each case supplied with the eleven bits having significances of $2^0$ to $2^{10}$ as amount bits and the polarity-determining most significant 16th bit, the second digital/analog converter 2b is supplied with the bits having significances of $2^4$ to $2^{14}$ as amount bits and also the most significant 16th bit.

The digital integrator used can also be a feedback-type adder according to the prior art.

The tracking circuit 6 is provided with an input selection switch 12 which can optionally apply the first or the second difference signal to the input of the difference discriminator 7.

The difference discriminator 7 is also provided with two further discriminators 8b, 8c which are constructed as window discriminators and which in each case determine whether the difference signal applied to its input lies between a second lower limit value $-U_b$ and a second upper limit value $+U_b$ or between a third lower limit value $-U_c$ and a third upper limit value $+U_c$, respectively. The absolute values $U_b$, $U_c$ of the second and third limit values can be, for example, 10-times and 150-times the value of the voltage corresponding to a least significant bit, that is to say a little more than one half of the voltages corresponding to a bit having the significance of $2^4$ and $2^8$. The discriminators 8b, c are followed by D-type flipflops 9b, c, controlled by the clock generator 10, also for temporary storage of their output signals.

The difference discriminator 7 is followed by a logic circuit 13 which, of the output signals of the flipflops 9a, 9b and 9c, passes only the signal having the highest priority to the integrator and inhibits all lower-priority signals, 9c having the highest and 9a having the lowest priority.

The output of the tracking circuit 6 is connected to an output selection switch 14 which can apply output signals of the logic circuit 13 in each case optionally to the counting input of one of two successive 4-bit up/down counters of the integrator 1. The input selection switch 12 and the output selection switch 14 are jointly controlled by a control logic 15 as a function of the out signals of the integrator 1. The control logic 15 contains a first EXOR gate 16 at the input of which the 16th and the 12th bits are present and the output of which is connected to the inverting set input of a first D-type flipflop 17 (for example SN 74 LS 74) to the clock input of which the output signal of a second EXOR gate 18 is fed to which the polarity-determining 16th bit is fed, once directly and one delayed by one clock period through a second D-type flip-flop 19, and the D-input of which is connected to earth.

In the text which follows, the operation of the analog/digital converter according to FIGS. 1 and FIG. 2 will be explained in greater detail, occasionally using the assistance of FIG. 3.

As long as the amount of the input signal is not very large so that—an analog "0" corresponds to a binary number at the output of the integrator 1 at which the most significant b 16th bit is "1" and the other bits are "0"—either, with a positive input signal, the 16th bit is "1" and the bits from the 12th to the 15th bit are "0" or, with a negative input signal, the reverse is the case—but in any case the bits from the 12th to the 15th bit differ from the 16th bit, the output signal $S_{15}$ of the control logic 15 is "0". The input selection switch 12 then applies the first difference signal, formed from the output signal of the first amplifier 4a and that of the first digital/analog converter 2a, to the input of the difference discriminator 7. As soon as the difference signal exceeds the first upper limit value $U_a$ or drops below the first lower limit value $-U_a$, the first discriminator 8a responds and generates a counting signal which, stored in flipflop 9a at the next positive edge of the clock signal and, together with the polarity signal stored in the flip-flop 9 passes as tracking signal via the logic circuit 13 and the output selection switch 14 as up- or down-counting signal to the first 4-bit up/down counter of the integrator 1 and at the next negative clock edge causes a least significant bit to be added to or subtracted from the binary number present at its output. With a rapid change of the input signal, the difference signal can become so large that it exceeds the second upper limit value $U_b$ or drops below the second lower limit value $-U_b$. In this case, the second discriminator 8b responds and triggers a counting signal which is directly passed to the counting input of the second 4-bit up/down counter 11b and causes a bit having the significance of $2^4$, corresponding to 16-times the value of a least significant bit, to be added or subtracted. A counting signal simultaneously triggered by the first discriminator 8a is then suppressed by the logic circuit 13. Correspondingly, when the third discriminator 8c responds, a counting signal is fed to the counting input of the third 4-bit up/down counter 11c and a bit having the significance of $2^8$, corresponding to 256-times the value of a least significant bit, is added or subtracted. This makes it possible to reproduce the input signal even with very rapid changes, although with a greater error than with slow changes but qualitatively correctly, which in the previously mentioned application of the analog/digital converter for processing the output signal of a current or voltage converter, permits the reproduction of transient disturbances which is important and also sufficiently qualitatively correct for protection purposes.

The second digital/analog converter 2b is in each case supplied with the bits from the 5th to the 16th bit from the output of the integrator 1. These bits form a binary number which corresponds to the binary number formed by all bits at the output of the integrator divided by 16, the remainder, the binary number formed by the four least significant bits, being omitted. Since the output signal of the first amplifier 4a and that of the first digital/analog converter 2a are continuously calibrated, the output signal of the second amplifier 4b which, of course, is in each case 1/16th of the output signal of the first amplifier 4a, and the output signal of the second digital/analog converter 2b are also continuously calibrated.

If then the amount of the input signal reaches an upper switching limit $U^+$ at which the 12th bit $B_{12}$ of the output signal, tracking the input signal, of the integrator 1 assumes a value which is equal to that of the 16th bit $B_{16}$, if, for example, the output signal $S_1$ shown in analog form in FIG. 3—drops below $-U^+$ so that the 12th bit $B_{12}$ at the output of the integrator 1 assumes the value "0", the range covered with the first digital/analog converter 2a is exceeded. The output signal $S_{16}$ of the first EXOR gate 16 changes to "0" and, fed to the inverting set input of the settable first D-type flip-flop 17 causes the output signal of the latter, which is simultaneously the output signal $S_{15}$ of the control logic 15, to be set to "1". The input selection switch 12 applies the second difference signal to the input of the difference discriminator 7. Simultaneously, the output selection switch 14 is also switched over so that the counting signals coming from the first discriminator 8a now reach the counting input of the second 4-bit up/down counter 11b and those of the other discriminators 8b, c are also redirected to the respectively next-higher 4-bit up/down counters 11c and 11d which amounts to an enlargement of the tracking steps by 16 times which compensates the division, effected by the non-consideration of the first four bits by the second digital/analog converter 2b, of the output number of the integrator 1 and the corresponding decrease in the analog signal with which the divided output number is compared.

The switching described happens within one clock period without additional loss of time. Although it leads to a 16-fold increase in the quantisation error, it also has the consequence that a rapidly fluctuating input signal can be tracked with 16-times larger tracking steps. Since in many applications the relative accuracy of the reproduction of the input signal is of special importance, the first factor is hardly disadvantageous; since, on the other hand, the rates of change of the input signal occurring frequently correspond to the respectively occurring maximum signal amplitudes, the second factor is highly advantageous under certain circumstances.

During the next zero crossing, the value of the polarity-determining 16th bit changes. Since the output signal $S_{19}$ of the second D-type flipflop 19 follows it delayed by one clock period, the output signal $S_{18}$ of the second EXOR gate 18 changes to "1" and retains this value for the duration of one clock period. Its positive edge causes the output signal of the first D-type flipflop 17, the D-input of which is connected to earth, that is to say the output signal $S_{15}$ of the control logic 15, to be set to "0". Zero thus acts as the lower switching limit.

The input selection switch 12 and the output selection switch 14 are reset again, the difference discriminato 7 is again supplied with the output signal of the first subtracter 3a. Since the first digital/analog converter 2a has been supplied for the whole time with the least significant 11 bits and the most significant 16th bit and the digital output signal has tracked the input signal with respect to the bits which are of higher significance than the fourth bit, the first digital/analog converter 2a is precalibrated, that is to say the difference between the output signal of the first amplifier 4a and that of the first digital/analog converter 2a appearing at the output of the first subtracter 3a normally has the order of magnitude, at the most, of the voltage corresponding to a bit having the significance of $2^4$ during the switching.

It is obvious that the analog/digital converter described can be easily expanded to more than two switching stages and its dynamic range can be correspondingly further extended.

We claim:

1. Analog/digital converter comprising a digital integrator (1), a first digital/analog converter (2a) which is supplied from the output of the digital integrator (1), in each case together with a polarity bit ($B_{16}$), with a group of amount bits, immediately succeeding each other with respect to their significances, which group includes the least significant amount bit, a first subtracter (3a) which forms the difference between a signal proportional to the input signal of the analog/digital converter and the output signal of the first digital/analog converter (2a) and a tracking circuit (6) which is supplied with the output signal of the first subtracter (3a) and generates the tracking signals for the digital integrator (1), controlled by the output signal of the first subtracter (3a) for at least as long as the number formed by the group of amount bits supplied to the first digital analog converter (2a) lies below an upper switching limit (U+), characterised in that the analog/digital converter contains at least one further digital/analog converter (2b) which is supplied from the output of the integrator (1), in each case simultaneously with the polarity bit, with a group of amount bits which immediately succeeded each other with respect to their significances, contains for each further digital/analog converter one further subtracter (3b) which forms the difference between a signal proportional to the input signal of the analog/digital converter and the output signal of the further digital/analog converter (2b), in which arrangement the lower limit and the upper limit of the significances of the amount bits fed to a further digital/analog converter (2b) are in each case greater than the lower limit or the upper limit of the significances of the amount bits fed to the preceding digital/analog converter (2a), the lower limit of the significances of the amount bits fed to a further digital/analog converter (2b) lies in each case below the upper limit of the significances of the amount bits fed to the preceding digital-/analog converter (2a), the signal fed to a further subtracter (3b) and proportional to the input signal of the analog/digital converter differs from the signal fed to the first subtracter (3a) and proportional to the input signal by a scaling factor of $2^{-n+1}$, n being in each case equal to the lower limit of the significances of the amount bits fed to the corresponding further digital/analog converter (2b), that furthermore, a control logic (15) is provided which controls the tracking circuit (6) as a function of the output signal of the digital integrator (1) in such a manner that when the amount of the number represented by the group of the bits fed to one of the digital/analog converters 2a) reaches an upper switching limit (U+), if necessary a tracking signal generated on the basis of the output signal of the respective further subtracter (3b) is next fed to the integrator (1), when the amount of the number represented by the group of the bits fed to one of the further digital-/analog converters (2b) reaches a lower switching limit, a tracking signal generated on the basis of the output signal of the respectively preceding subtracter (3a) is next fed to the integrator (1), in which arrangement a tracking step induced on the basis of the output signal of one of the further subtracters (3b) differs by the inverse of the respective scaling factor, that is to say by $2^{n-1}$, from a tracking step induced on the basis of an equally large output signal of the first subtracter (3a).

2. Analog/digital converter according to claim 1, the tracking circuit of which contains a difference discriminator (7) which is in each case supplied with one of the output signals of the subtracters (3a, 3b) and which contains a first discriminator (8a) which compares the signal fed to the difference discriminator (7) with a positive first upper limit value ($U_a$) and with a negative first lower limit value ($-U_a$) and if the signal exceeds the first upper limit value ($U_a$) and drops below the first lower limit value ($-U_a$) generates in each case a corresponding tracking signal for incrementing or decrementing the number present at the output of the digital integrator (1), characterised in that the difference discriminator (4)

contains at least one further discriminator (8b, 8c) which compares the signal fed to the difference discriminator (7) with a further upper limit value ($U_b$; $U_c$) and with a further lower limit value ($-U_b$; $-U_c$), and if the signal exceeds the further upper limit value ($U_b$; $U_c$) and drops below the further lower limit value ($-U_b$; $-U_c$) generates in each case a corresponding tracking signal for incrementing or decrementing the number present at the output of the digital integrator (1), in which arrangement the absolute value of a further upper limit value and a further lower limit value are in each case greater than the preceding upper limit value or the preceding lower limit value, the absolute value of the number, by which the number present at the output of the digital integrator (1) is incremented or decremented because of the response of a further discriminator (8b; 8c), is greater in each case than the number added or subtracted because of the response of the preceding discriminator (8a; 8b).

* * * * *